United States Patent
Yen et al.

(10) Patent No.: US 10,928,730 B2
(45) Date of Patent: Feb. 23, 2021

(54) PHOTOSENSITIVE RESIN COMPOSITION, AND POLYMER FILM MADE THEREFROM

(71) Applicant: Zhen Ding Technology Co., Ltd., Taoyuan (TW)

(72) Inventors: Chen-Feng Yen, Taoyuan (TW); Shou-Jui Hsiang, Taoyuan (TW); Pei-Jung Wu, Taoyuan (TW); Szu-Hsiang Su, Taoyuan (TW)

(73) Assignee: Zhen Ding Technology Co., Ltd., Taoyuan (TW)

( * ) Notice: Subject to any disclaimer, the term of this patent is extended or adjusted under 35 U.S.C. 154(b) by 279 days.

(21) Appl. No.: 16/027,327

(22) Filed: Jul. 4, 2018

(65) Prior Publication Data

US 2019/0361349 A1  Nov. 28, 2019

(30) Foreign Application Priority Data

May 22, 2018 (CN) .......................... 201810495434.1

(51) Int. Cl.
| | |
|---|---|
| *G03F 7/038* | (2006.01) |
| *G03F 7/32* | (2006.01) |
| *C08G 18/67* | (2006.01) |
| *C08F 2/50* | (2006.01) |
| *C08F 299/06* | (2006.01) |
| *G03F 7/037* | (2006.01) |

(52) U.S. Cl.
CPC ............. *G03F 7/0387* (2013.01); *C08F 2/50* (2013.01); *C08F 299/065* (2013.01); *C08G 18/672* (2013.01); *G03F 7/037* (2013.01); *G03F 7/0388* (2013.01); *G03F 7/322* (2013.01)

(58) Field of Classification Search
CPC ....... G03F 7/037; G03F 7/0387; G03F 7/0388
USPC ........................................... 430/280.1, 287.1
See application file for complete search history.

(56) References Cited

U.S. PATENT DOCUMENTS

2016/0018733 A1\* 1/2016 Lin ...................... G03F 7/0388
430/283.1

FOREIGN PATENT DOCUMENTS

| KR | 2016-020229 | \* | 2/2016 |
|---|---|---|---|
| TW | 200906881 A | | 2/2009 |
| TW | 201807497 A | | 3/2018 |

OTHER PUBLICATIONS

Computer-generated translation of KR 2016-020229 (Feb. 2016) (Year: 2016).\*

\* cited by examiner

*Primary Examiner* — John A McPherson
(74) *Attorney, Agent, or Firm* — ScienBiziP, P.C.

(57) ABSTRACT

A photosensitive resin composition comprises a modified polyimide polymer having a chemical structural formula of:

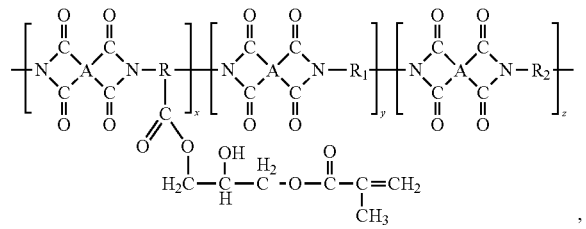

photosensitive monomers, a bisphenol A epoxy resin, a photo-initiator, and a pigment. The modified polyimide polymer is made by a reaction of a polyimide polymer having a chemical structural formula of:

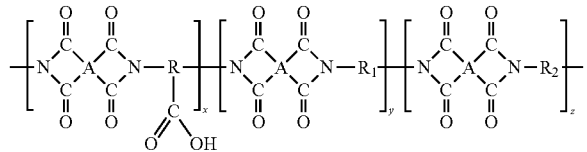

and glycidyl methacrylate. The carboxyl group of the polyimide polymer reacts with the epoxy group of glycidyl methacrylate. The polyimide polymer is made by a reaction of dianhydride monomers each having an A group, diamine monomers each having the R group, diamine monomers each having the $R_1$ group, and diamine monomers each having the $R_2$ group. The diamine monomer having R group is a diamine compound having R group bonding with the carboxyl group. The diamine monomer having $R_1$ group is a soft long-chain diamine monomer. $R_2$ group comprises at least one secondary amine group or tertiary amine group.

12 Claims, 1 Drawing Sheet

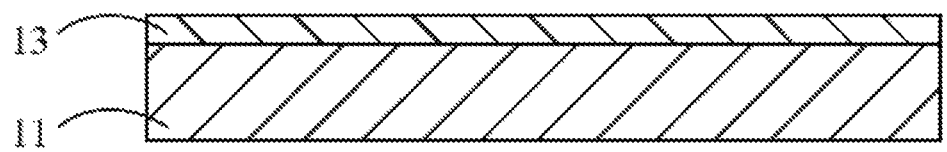

PHOTOSENSITIVE RESIN COMPOSITION, AND POLYMER FILM MADE THEREFROM

FIELD

The subject matter herein generally relates to a photosensitive resin composition, and a polymer film using the photosensitive resin composition.

BACKGROUND

Photosensitive resin compositions are usually of polyurethane acrylic resin. However, polymer films made by the polyurethane acrylic resin are less tolerant of heat. Epoxy acrylic resin can be added into the polyurethane acrylic resin to improve the thermal resistance of the polymer film. However, the flexibility of the polymer film will be significantly reduced because of the epoxy acrylic resin.

BRIEF DESCRIPTION OF THE DRAWINGS

Implementations of the present technology will now be described, by way of example only, with reference to the attached FIGURES.

The FIGURE is a diagram of an exemplary embodiment of a copper clad plate comprising at least one copper foil and at least one polymer film.

DETAILED DESCRIPTION

It will be appreciated that for simplicity and clarity of illustration, where appropriate, reference numerals have been repeated among the different FIGURES to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

An embodiment of a photosensitive resin composition is disclosed. The photosensitive resin composition comprises 100 parts by weight of a modified polyimide polymer, 10 parts to 40 parts by weight of photosensitive monomers, 10 parts to 25 parts by weight of a bisphenol-A epoxy resin, 1 part to 10 parts by weight of a photo-initiator, and 1 part to 5 parts by weight of a coloring agent.

The modified polyimide polymer has a chemical structural formula of

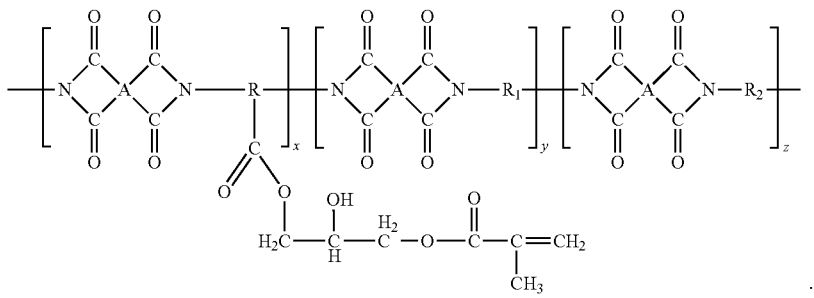

The modified polyimide polymer is made by a reaction of a polyimide polymer having a chemical structural formula of

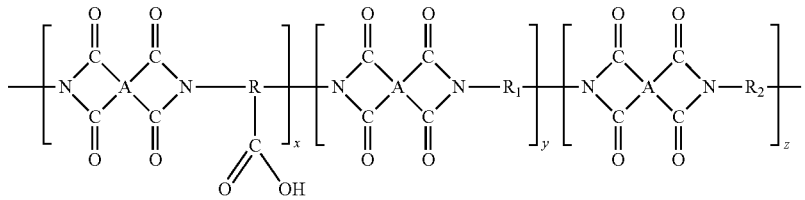

and glycidyl methacrylate having a chemical structural formula of

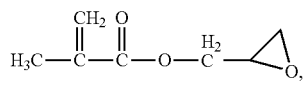

wherein the carboxyl group bonded with R group of the polyimide polymer reacts with the epoxy group of glycidyl methacrylate. The polyimide polymer is made by a polymerization reaction of dianhydride monomers each having an A group, diamine monomers each having a R group, diamine monomers each having a $R_1$ group, and diamine monomers each having a $R_2$ group. A degree of polymerization x, a degree of polymerization y, and a degree of polymerization z each is a natural number greater than 1.

The dianhydride monomer having A group may be selected from a group consisting of 4,4'-bis(phthalic anhydride)sulfide having a CAS number 25884-43-9, bis-(3-phthalyl anhydride) ether having a CAS number 1823-59-2, bicyclo[2.2.2]oct-7-ene-2,3,5,6-tetracarboxylic acid dianhydride having a CAS number 1719-83-1, N,N'-(5,5'-(perfluoropro-pane-2,2-diyl)bis(2-hydroxy-5,1-phenylene))bis (1,3-dioxo-1,3-dihydroisobenzofuran-5-arboxamide) having a CAS number 223255-30-9, bicyclooctanetetracarboxylic dianhydride having a CAS number 2754-40-7, and any combination thereof.

The diamine monomer having R group is a diamine compound having R group bonded with the carboxyl group.

In at least one embodiment, R group comprises at least one phenyl group, and the carboxyl group is bonded with the phenyl group.

In at least one embodiment, the diamine monomer having R group may be selected from a group consisting of 5,5'-

In at least one embodiment, the modified polyimide polymer has a molar mass of about 5000 g/mol to about 20000 g/mol.

The photosensitive monomer may be selected from at least one of water-soluble photosensitive monomer and water dispersible photosensitive monomer. The photosensitive monomer may be an acrylate compound containing ethoxy groups.

In at least one embodiment, the number of the ethoxy groups is greater than or equal to 10, to improve hydrophilicity and flexibility of a polymer film made by the photosensitive resin composition.

The photosensitive monomer comprises a plurality of reactive functional groups to react with the modified polyimide polymer under ultraviolet illumination.

In at least one embodiment, the number of the reactive functional groups is greater than or equal to 2.

The photosensitive monomer may be selected from at least one of polyethylene glycol di(meth)acrylate, ethoxylated 1,6-hexanediol diacrylate, ethoxylted bisphenyl fluorene diacrlate, ethoxylated bisphenol-A di(meth)acrylate, ethoxylated trimethylolpropane tri(meth)acrylate, ethoxylated pentaerythritol tetraacrylate, ethoxylated dipentaerythritol hexaacrylate, and any combination thereof.

The bisphenol-A epoxy resin has a chemical structural formula of

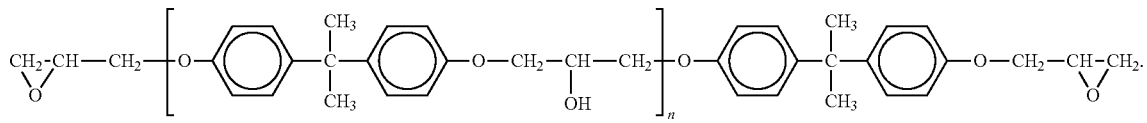

methylenebis(2-aminobenzoic acid), 3,5-diaminobenzoic acid, 1,3-bis(4-amino-2-carboxyphenoxy)benzene having a CAS number 1620566-43-9, 3,5-bis(4-Aminophenoxy)Benzoic acid, 5-amino-2-(4-aminophenoxy)benzoic acid having a CAS number 135209-70-0, N-bis(4-aminophenyl)-4-carboxylaniline having a CAS number 1071762-58-7, 3,5-diamino-4-methoxybenzoic acid having a CAS number 177960-30-4, 3,4-diaminobenzoic acid, and any combination thereof.

The diamine monomer having $R_1$ group is a soft long-chain diamine monomer.

In at least one embodiment, the diamine monomer having $R_1$ group may be selected from a group consisting of (3-aminopropyl)-terminated dimethylsiloxane having a CAS number 97917-34-5, triethylenetetramine, tetraethylenepentamine, polyetheramine having a CAS number 400760-04-5, 796093-55-5, 9046-10-0, or 9046-10-0, and any combination thereof.

$R_2$ group comprises at least one secondary amine group or tertiary amine group.

In at least one embodiment, the diamine monomer having $R_2$ group may be selected from a group consisting of 4,4'-diamino-2'-methylbenzanilide having a CAS number 14303-59-4, 4-amino-N-(4-amino-2-methoxyphenyl)benzamide having a CAS number 14071-33-1, 1,4-bis-N,N'-(4'-aminophenyl)terephtalamide having a CAS number 34066-75-6, 4,4'-diaminobenzanilide having a CAS number 785-30-8, N,N'-bis(4-aminobenzoyl)-p-phenylenediamine having a CAS number 2362-26-7, 3-amino-N-(4-aminophenyl)benzamide having a CAS number 2657-93-4, and any combination thereof.

In at least one embodiment, the bisphenol-A epoxy resin has an epoxy equivalent weight of about 180 g/Eq to about 2000 g/Eq.

The photo-initiator absorbs ultraviolet light to form free radicals or kations, thereby initiating a reaction of the modified polyimide polymer, photosensitive monomers, and the bisphenol-A epoxy resin.

In at least one embodiment, the photo-initiator can be selected from a group consisting of α-hydroxy ketone, acylphosphine oxide, α-amino ketone, ester compound, and any combination thereof.

In at least one embodiment, the photo-initiator is selected from a group consisting of 2-hydroxyl-2-methyl-1-phenyl-1-acethone, 1-hydroxy cyclohexyl phenyl ketone, benzil dimethyl ketal, diphenyl ketone, isopropylthioxanthone, diphenyl (2,4,6-trimethylbenzoyl) phosphine oxide, phenyl di(2,4,6-trimethylbenzoyl) phosphine oxide, 2-methyl-1-(4-methylthiophenyl)-2-morpholino-1-acetone, 2-benzyl-2-dimethylamino-1-(4-morpholino phenyl)-1-butanone, carbazole oxime ester, and any combination thereof.

The coloring agent can allow desired colors for the photosensitive resin composition. The coloring agent can be selected from a group consisting of a pigment, a dye, and any combination thereof.

The pigment can be selected from a group consisting of an inorganic pigment, an organic pigment, and any combination thereof.

In at least one embodiment, the pigment can be selected from a group consisting of phthalo blue, phthalo green, crystal violet, titanium dioxide, carbon black, iron oxide black, aniline black, and any combination thereof.

The dye can be selected from a group consisting of natural organic dye, synthesized organic dye, and any combination thereof.

In at least one embodiment, the dye can be selected from a group consisting of Kayase Red-B (trade name, available commercially from NIPPON KAYAKU), Black-AN (trade name, available commercially from NIPPON KAYAKU), Neozapon Red 355 (trade name, available commercially from BASF Corporation), Orasol Black-X55 (trade name, available commercially from BASF Corporation), Oracet Yellow-144FE (trade name, available commercially from BASF Corporation), Everzol Black N (trade name, available commercially from Everlight Chemical Industrial Corporation), Evercion Red H-E3B (trade name, available commercially from Everlight Chemical Industrial Corporation), Evercion Yellow He4R (trade name, available commercially from Everlight Chemical Industrial Corporation), AS Black 8905B (trade name, available commercially from Everlight Chemical Industrial Corporation), AS Black 8A316 (trade name, available commercially from Everlight Chemical Industrial Corporation), and any combination thereof.

In at least one embodiment, the photosensitive resin composition can further comprise 5 parts to 30 parts of inorganic filler particles.

The inorganic filler particles can be selected from a group consisting of silicon dioxide, aluminum oxide, aluminum hydroxide, magnesium oxide, magnesium hydroxide, calcium carbonate, aluminum nitride, boron nitride, aluminum silicon carbide, silicon carbide, sodium carbonate, titanium dioxide, zinc oxide, zirconium oxide, quartz, graphite, magnesium carbonate, potassium titanate, mica, calcium phosphate, talcum, silicon nitride, kaolin, barium sulfate, and any combination thereof.

The photosensitive resin composition can be prepared by following steps. 100 parts by weight of the modified polyimide polymer, 10 parts to 40 parts by weight of the photosensitive monomers, 10 parts to 25 parts by weight of the bisphenol-A epoxy resin, 1 part to 10 parts by weight of the photo-initiator, and 1 part to 5 parts by weight of the coloring agent are mixed, alternatively, 100 parts by weight of the modified polyimide polymer, 10 parts to 40 parts by weight of the photosensitive monomers, 10 parts to 25 parts by weight of the bisphenol-A epoxy resin, 1 part to 10 parts by weight of the photo-initiator, 1 part to 5 parts by weight of the coloring agent, and 5 parts to 30 parts of inorganic filler particles are mixed, thereby forming the photosensitive resin composition.

An embodiment of a polymer film (shown in the FIGURE) made by heating and curing the photosensitive resin composition.

The FIGURE illustrates a copper clad plate 10 comprising at least one copper foil 11 and at least one polymer film 13, each being attached to one surface of each copper foil 11.

Because the photosensitive resin composition comprises the modified polyimide polymer and the bisphenol-A epoxy resin, the polymer film 13 made by the photosensitive resin composition has an excellent alkali resistance, an excellent thermostability, an excellent flexibility.

Example 1

100 g of the modified polyimide polymer having a molar mass of 5000 g/mol, 40 g of ethoxylated trimethylolpropane tri(meth)acrylate, 10 g of 1-hydroxy cyclohexyl phenyl ketone, 2 g of phthalocyanine blue, 30 g of barium sulfate, and 25 g of the bisphenol-A epoxy resin were mixed to form the photosensitive resin composition.

Example 2

100 g of the modified polyimide polymer having a molar mass of 5000 g/mol, 20 g of ethoxylated trimethylolpropane tri(meth)acrylate, 10 g of 1-hydroxy cyclohexyl phenyl ketone, 2 g of phthalocyanine blue, 5 g of barium sulfate, and 12.5 g of the bisphenol-A epoxy resin were mixed to form the photosensitive resin composition.

Comparative Example 1

100 g of a polyurethane acrylic resin having a molar mass of 20000 g/mol, 20 g of ethoxylated trimethylolpropane tri(meth)acrylate, 10 g of 1-hydroxy cyclohexyl phenyl ketone, 2 g of phthalocyanine blue, 15 g of barium sulfate, and 30 g of 1-methyl-2-pyrrolidinone were mixed to form a photosensitive resin composition.

Comparative Example 2

100 g of an epoxy acrylic resin having a molar mass of 10000 g/mol, 20 g of ethoxylated trimethylolpropane tri (meth)acrylate, 10 g of 1-hydroxy cyclohexyl phenyl ketone, 2 g of phthalocyanine blue, 15 g of barium sulfate, 30 g of 1-methyl-2-pyrrolidinone, and 18.5 g of the bisphenol-A epoxy resin were mixed to form a photosensitive resin composition.

Comparative Example 3

100 g of the modified polyimide polymer having a molar mass of 5000 g/mol, 20 g of ethoxylated trimethylolpropane tri(meth)acrylate, and 10 g of 1-hydroxy cyclohexyl phenyl ketone were mixed to form a photosensitive resin composition.

Five test samples were made. Each of the five test samples comprises a copper foil and a polymer film made by curing photosensitive resin composition of the example 1, the example 2, the comparative example 1, the comparative example 2, and the comparative example 3, respectively. Each polymer film was exposed and developed.

The test samples were performed by a copper chloride test, an adhesion strength test under ASTM standard, an alkalis resistance test, a thermal resistance test, a flexibility test, and a storage stability test at normal temperature. The test results are shown in table 1.

The copper chloride test was carried out by immersing the test samples into a copper chloride solution and observing whether any discoloring happens to the copper foil, thereby determining whether the desired portion of the polymer films were completely etched during development.

The alkalis resistant test was carried out by immersing the test samples into a sodium hydroxide solution having a mass concentration of about 10% and observing whether the polymer films peeled off. The flexibility test was carried out by bending the test samples through 360 degrees and calculating the number of times that the test samples remained non-fractured after being bent.

The thermal resistance was tested at a temperature of 288 degrees centigrade for 30 seconds, if the polymer film did not blister and peel off, the result of the thermal resistance test is considered passing, otherwise, the result fails.

The storage stability test at normal temperature was carried out by making the test samples by the photosensitive resin compositions which are stored at the normal temperature for one month, repeating the copper chloride test, the adhesion strength test, the alkalis resistance test, and the thermal resistance test, and determining whether the test results were deteriorated. If so, the properties of the photosensitive resin compositions remain unchanged during the storage; otherwise, the properties were changed during the storage.

TABLE 1

| Property | Example 1 | Example 2 | Comparative Example 1 | Comparative Example 2 | Comparative Example 3 |
|---|---|---|---|---|---|
| | | | Product | | |
| Results of the copper chloride test | Immediately discolor | Immediately discolor | No discolor after 10 seconds | No discolor after 10 seconds | Immediately discolor |
| Adhesion strength | 5B | 5B | 4B | 4B | 5B |
| Results of the alkalis resistance test | No peeled off, and having a adhesion strength of 5B | No peeled off, and having a adhesion strength of 5B | No peeled off, and having a adhesion strength of 4B | No peeled off, and having a adhesion strength of 4B | No peeled off, and having a adhesion strength of 5B |
| Results of the thermal resistance test | Passing | Passing | Failing | Passing | Failing |
| Results of the flexibility test | 5 | 10 | 3 | 2.5 | 10 |
| Results of the storage stability test | Unchanged | Unchanged | Unchanged | Changed | Unchanged |

Table 1 illustrates that the photosensitive resin compositions of the above examples 1-2 have improved developing property, adhesion strength, alkalis resistance, thermal resistance, and flexibility, comparing to the photosensitive resin composition of the above comparative example 1 formed by the polyurethane acrylic resin without the bisphenol-A epoxy resin. The photosensitive resin compositions of the above examples 1-2 have improved developing property, adhesion strength, alkalis resistance, flexibility, and storage stability, comparing to the photosensitive resin composition of the above comparative example 2 formed by the epoxy acrylic resin and the bisphenol-A epoxy resin. The photosensitive resin compositions of the above examples 1-2 have improved thermal resistance, comparing to the photosensitive resin composition of the above comparative example 3 formed without coloring agent, inorganic filler particles and the bisphenol-A epoxy resin.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A photosensitive resin composition comprising:
   100 parts by weight of a modified polyimide polymer having a chemical structural formula of

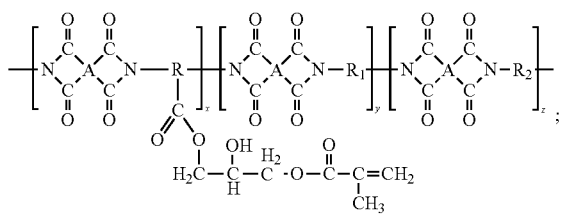

10 parts to 40 parts by weight of photosensitive monomers;
   10 parts to 25 parts by weight of a bisphenol-A epoxy resin having a chemical structural formula of

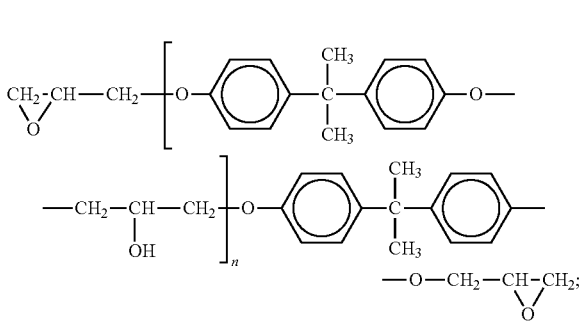

1 part to 10 parts by weight of a photo-initiator; and
   1 part to 5 parts by weight of a coloring agent;
   wherein the modified polyimide polymer is made by a reaction of a polyimide polymer having a chemical structural formula of

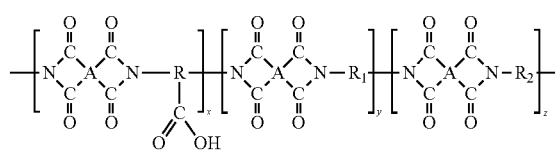

and glycidyl methacrylate, during the reaction, the carboxyl group bonded with R group of the polyimide polymer reacts with the epoxy group of glycidyl methacrylate; the polyimide polymer is made by a polymerization reaction of dianhydride monomers each having an A group, diamine monomers each having a R group, diamine monomers each having a $R_1$ group, and diamine monomers each having a $R_2$ group; the diamine monomer having R group is a diamine compound having R group bonded with the carboxyl group, the diamine monomer having $R_1$ group is a soft long-chain diamine monomer, $R_2$ group comprises at least one secondary amine group or tertiary amine group; a degree of polymerization x, a degree of polymerization y, and a degree of polymerization z each is a natural number greater than 1, the epoxy resin has an epoxy equivalent weight of about 180 g/Eq to about 2000 g/Eq, the dianhydride monomer A group is selected from a group consisting of 4,4'-bis (phthalic anhydride)sulfide having a CAS number 25884-43-9, bis-(3-phthalyl anhydride) ether having a CAS number 1823-59-2, bicyclo[2.2.2]oct-7-ene-2,3,5,6-tetracarboxylic acid dianhydride having a CAS number 1719-83-1, N,N'-(5,5'-(perfluoropro-pane-2,2-diyl) bis(2-hydroxy-5,1-phenylene))bis(1,3-dioxo-1,3-dihydroisobenzofuran-5-arboxamide) having a CAS number 223255-30-9, bicyclooctanetetracarboxylic dianhydride having a CAS number 2754-40-7, and any combination thereof; the diamine monomer having R group is selected from a group consisting of 5,5'-methylenebis(2-aminobenzoic acid), 3,5-diaminobenzoic acid, 1,3-bis(4-amino-2-carboxyphenoxy) benzene having a CAS number 1620566-43-9, 3,5-bis(4-Aminophenoxy)Benzoic acid, 5-amino-2-(4-aminophenoxy)benzoic acid having a CAS number 135209-70-0, N-bis(4-aminophenyl)-4-carboxylaniline having a CAS number 1071762-58-7, 3,5-diamino-4-methoxybenzoic acid having a CAS number 177960-30-4, 3,4-diaminobenzoic acid, and any combination thereof; the diamine monomer having $R_1$ group is selected from a group consisting of (3-aminopropyl)-terminated dimethylsiloxane having a CAS number 97917-34-5, triethylenetetramine, tetraethylenepentamine, polyetheramine having a CAS number 400760-04-5, 796093-55-5, 9046-10-0, or 9046-10-0, and any combination thereof.

2. The photosensitive resin composition of claim 1, wherein the diamine monomer having $R_2$ group is selected from a group consisting of 4,4'-diamino-2'-methylbenzanilide having a CAS number 14303-59-4, 4-amino-N-(4-amino-2-methoxyphenyl)benzamide having a CAS number 14071-33-1, 1,4-bis-N,N'-(4'-aminophenyl)terephtalamide having a CAS number 34066-75-6, 4,4'-diaminobenzanilide having a CAS number 785-30-8, N,N'-bis(4-aminobenzoyl)-p-phenylenediamine having a CAS number 2362-26-7, 3-amino-N-(4-aminophenyl)benzamide having a CAS number 2657-93-4, and any combination thereof.

3. The photosensitive resin composition of claim 1, wherein the modified polyimide polymer has a molar mass of about 5000 g/mol to about 20000 g/mol, the epoxy resin has an epoxy equivalent weight of about 180 g/Eq to about 2000 g/Eq.

4. The photosensitive resin composition of claim 1, wherein the photosensitive monomer is an acrylate compound containing ethoxy groups.

5. The photosensitive resin composition of claim 4, wherein the number of the ethoxy groups is greater than or equal to 10.

6. The photosensitive resin composition of claim 5, wherein the photosensitive monomer is selected from at least one of polyethylene glycol di(meth)acrylate, ethoxylated 1,6-hexanediol diacrylate, ethoxylted bisphenyl fluorene diacrlate, ethoxylated bisphenol-A di(meth)acrylate, ethoxylated trimethylolpropane tri(meth)acrylate, ethoxylated pentaerythritol tetraacrylate, ethoxylated dipentaerythritol hexaacrylate, and any combination thereof.

7. The photosensitive resin composition of claim 1, wherein the photosensitive resin composition further comprises 5 parts to 30 parts of inorganic filler particles.

8. A polymer film made by curing a photosensitive resin composition, the photosensitive resin composition comprising:

100 parts by weight of a modified polyimide polymer having a chemical structural formula of

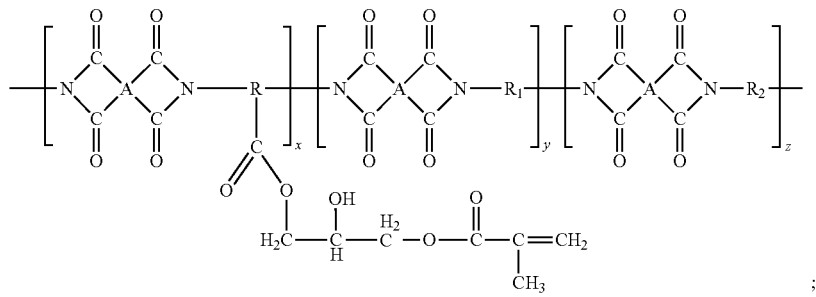

10 parts to 40 parts by weight of photosensitive monomers;

10 parts to 25 parts by weight of a bisphenol-A epoxy resin having a chemical structural formula of

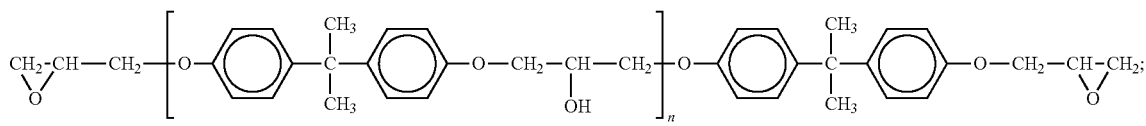

1 part to 10 parts by weight of a photo-initiator; and 1 part to 5 parts by weight of a coloring agent;

wherein the modified polyimide polymer is made by a reaction of a polyimide polymer having a chemical structural formula of

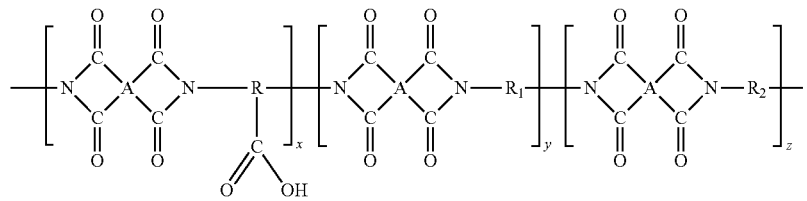

and glycidyl methacrylate, during the reaction, the carboxyl group bonded with R group of the polyimide polymer reacts with the epoxy group of glycidyl methacrylate; the polyimide polymer is made by a polymerization reaction of dianhydride monomers each having an A group, diamine monomers each having a R group, diamine monomers each having a $R_1$ group, and diamine monomers each having a $R_2$ group; the diamine monomer having R group is a diamine compound having R group bonded with the carboxyl group, the diamine monomer having $R_1$ group is a soft long-chain diamine monomer, $R_2$ group comprises at least one secondary amine group or tertiary amine group; a degree of polymerization x, a degree of polymerization y, and a degree of polymerization z each is a natural number greater than 1, the epoxy resin has an epoxy equivalent weight of about 180 g/Eq to about 2000 g/Eq, the dianhydride monomer having A group is selected from a group consisting of 4,4'-bis(phthalic anhydride)sulfide having a CAS number 25884-43-9, bis-(3-phthalyl anhydride) ether having a CAS number 1823-59-2, bicyclo[2.2.2]oct-7-ene-2,3,5,6-tetracarboxylic acid dianhydride having a CAS number 1719-83-1, N,N'-(5,5'-(perfluoropro-pane-2,2-diyl) bis(2-hydroxy-5,1-phenylene))bis(1,3-dioxo-1,3-dihydroisobenzofuran-5-arboxamide) having a CAS number 223255-30-9, bicyclooctanetetracarboxylic dianhydride having a CAS number 2754-40-7, and any combination thereof; the diamine monomer having R group is selected from a group consisting of 5,5'-methylenebis(2-aminobenzoic acid), 3,5-diaminobenzoic acid, 1,3-bis(4-amino-2-carboxyphenoxy) benzene having a CAS number 1620566-43-9, 3,5-bis(4-Aminophenoxy)Benzoic acid, 5-amino-2-(4-aminophenoxy)benzoic acid having a CAS number 135209-70-0, N-bis(4-aminophenyl)-4-carboxylaniline having a CAS number 1071762-58-7, 3,5-diamino-4-methoxybenzoic acid having a CAS number 177960-30-4, 3,4-diaminobenzoic acid, and any combination thereof; the diamine monomer having $R_1$ group is selected from a group consisting of (3-aminopropyl)-terminated dimethylsiloxane having a CAS number 97917-34-5, triethylenetetramine, tetraethylenepentamine, polyetheramine having a CAS number 400760-04-5, 796093-55-5, 9046-10-0, or 9046-10-0, and any combination thereof.

9. The polymer film of claim 8, wherein the diamine monomer having $R_2$ group is selected from a group consisting of 4,4'-diamino-2'-methylbenzanilide having a CAS number 14303-59-4, 4-amino-N-(4-amino-2-methoxyphenyl)benzamide having a CAS number 14071-33-1, 1,4-bis-N,N'-(4'-aminophenyl)terephtalamide having a CAS number 34066-75-6, 4,4'-diaminobenzanilide having a CAS number 785-30-8, N,N'-bis(4-aminobenzoyl)-p-phenylenediamine having a CAS number 2362-26-7, 3-amino-N-(4-aminophenyl)benzamide having a CAS number 2657-93-4, and any combination thereof.

10. The polymer film of claim 8, wherein the modified polyimide polymer has a molar mass of about 5000 g/mol to about 20000 g/mol.

11. The polymer film of claim 8, wherein the photosensitive monomer is an acrylate compound containing ethoxy groups, the number of the ethoxy groups is greater than or equal to 10, the number of reactive functional groups contained in the photosensitive monomer is greater than or equal to 2.

12. The polymer film of claim 8, wherein the photosensitive resin composition further comprises 5 parts to 30 parts of inorganic filler particles.

* * * * *